United States Patent [19]

Marcus et al.

[11] Patent Number: 4,632,856
[45] Date of Patent: Dec. 30, 1986

[54] MULTILAYER THIN FILM ELECTRICAL DEVICES FREE OF ADHESIVE

[76] Inventors: Michael A. Marcus; Edward D. Morrison, both of Kodak Park, Rochester, N.Y. 14650

[21] Appl. No.: 698,974

[22] Filed: Feb. 6, 1985

[51] Int. Cl.$^4$ .................... B32B 3/00; B32B 15/08
[52] U.S. Cl. ............................. 428/172; 156/288; 361/323; 427/79; 427/100; 427/261; 427/265; 428/194; 428/336; 428/461; 428/421
[58] Field of Search ............. 428/172, 421, 461, 194, 428/336; 156/273.7, 288; 264/345; 361/323; 427/261, 265, 100, 79

[56] References Cited

U.S. PATENT DOCUMENTS

| | | | |
|---|---|---|---|
| 3,991,451 | 11/1976 | Murayama | 264/345 |
| 4,049,859 | 9/1977 | Yoshikawa et al. | 428/172 |
| 4,378,620 | 4/1983 | Lavene | 361/323 |
| 4,405,402 | 9/1983 | Quillian | 156/273.7 |
| 4,427,609 | 1/1984 | Broussoux et al. | 428/421 X |

OTHER PUBLICATIONS

SPE Journal, Dec. 1971, vol. 27, pp. 42–48, Williams, Jr. et al.
Marcus, Ferroelectrics "Performance Characteristics of Piezoelectric Polymer Flexure Mode Devices", vol. 57, Jul. 1984, pp. 203–220.

Primary Examiner—Thomas J. Herbert

[57] ABSTRACT

There is disclosed a laminate comprising alternating polymer sheets and metal layers between the polymer sheets, the laminate being substantially free of adhesive. Each polymer sheet of the laminate has a thickness not exceeding about 25 μm, and the resistivity of the metal layer is from 1 to about 4 ohms/square. Such laminates are useful in making capacitors and piezoelectric multimorphs.

A method of making such laminates is also disclosed, wherein a plurality of metal-coated polymer sheets are compressed, in the absence of an adhesive, under pressure sufficient to reduce the thickness of each of the polymeric film layers to a value that is no larger than about 25 μm.

8 Claims, 4 Drawing Figures

MULTILAYER THIN FILM ELECTRICAL DEVICES FREE OF ADHESIVE

FIELD OF THE INVENTION

This invention relates to thin film electrical devices that are polymer film laminates, as well as to a method of making the laminates

BACKGROUND OF THE INVENTION

Certain thin film electrical devices, such as capacitors and polymeric piezoelectric devices, rely heavily on a polymeric film on which is formed at least one electrode. The films are often prepared by stretching and thinning a cast or extruded sheet. For example, poly(-vinylidene fluoride), hereinafter $PVF_2$, commonly is prepared by extruding a sheet with a thickness of, e.g., about 50 $\mu$m, and after cooling, stretching the sheet to reduce its thickness about four times, e.g., to 12 $\mu$m. The result is a beta-phase $PVF_2$. If the $PVF_2$ is deposited with aluminum on one or both sides prior to stretching, the stretched product can be wrapped on a core to produce a capacitor. That is, the metal coating on the dielectric is applied so that a margin of the dielectric is left uncoated. Since the next adjacent dielectric is uncoated on the *opposite* margin, at least two such separate films, each stretched, are used to make the composite.

Optimum results, particularly in the case of a capacitor, occur when many layers are used together, with the dielectric layers being as thin as possible. The thinner the dielectric film is, the higher is the dielectric constant. The same is true for piezoelectric multimorphs—best results are obtained when using as many layers as possible, as reported in *Ferroelectrics* 7/2/84, Vol. 57, p. 203 and especially p. 215. However, when such $PVF_2$ layers are much less than 10 $\mu$m in thickness after stretching, they become very difficult to handle. Particularly such is the case when two such films must be rewound, after stretching, into a composite structure as noted above.

Therefore, there has been a need, prior to this invention, to provide a laminate of metal and very thin dielectric film which provides all the layers that are needed to complete a product such as a capacitor or piezoelectric multimorph. There has been described heretofore a laminate-making technique which, however, requires the use of an adhesive. That is, U.S. Pat. No. 4,427,609 describes a laminate formed by thinning by rolling in one pass under high pressure and temperature, a stack of dielectric sheets spaced apart by electrodes. Poling occurs while the rolling takes place. However, the technique is said to be inapplicable to "thin aluminum films or evaporated metallic layers", col. 4, lines 58-62. As a result, the patent calls for the use of conductive glue when making a bimorph, col 6, lines 26-32, the last embodiment. In such a case, the adhesive is present between adjacent polymer layers and must be polymerized to set. Such polymerizing requires an additional manufacturing time of from 5 to 24 hours, a length of time that far exceeds the time of the initial rolling operation. Furthermore, the adhesive tends to interfere, at least in the case of multimorphs, with the efficiency of the device. That is, the bending of a multimorph tends to be reduced by the finite thickness of the adhesive.

SUMMARY OF THE INVENTION

We have discovered that the prohibition against using dry deposited metal layers on the polymer films to be rolled, and/or against making a laminate without adhesive, assumed by the prior art, is in fact incorrect at least in certain circumstances. We have further discovered that such dry-deposited metal layers themselves can be used as a bonding agent that laminates the polymer films together, even though the metal layers are substantially free of adhesive on or within the layers. As used herein, "adhesive" means a composition that (a) is different from the other materials described and (b) has as its primary property, the ability to bond the polymer films together, usually by a chemical reaction.

More specifically, there is provided a laminate of alternating layers of electrically conductive metal and an orientable polymer film, each layer of metal being integrally bonded to both adjacent layers of film. The laminate has a thickness for each polymer film that does not exceed about 25 $\mu$m. The laminate further is generally free of adhesive either on or within each metal layer.

In accord with another aspect of the invention, there is provided a method for making a laminate. The method comprises the steps of (a) providing multiple layers of an orientable polymeric film having thicknesses no greater than about 100 $\mu$m;

(b) applying a coherent dry coating of electrically conductive metal that is generally free of adhesive, on a surface of each of the layers, the metal coatings having a maximum thickness no greater than that which is effective, after the next step in the method, to produce a resistivity of about 1 to 4 ohms/square; and (c) compressing and laminating together simultaneously all of the coated polymer film layers under pressure sufficient to reduce the thickness of each of the polymeric film layers to a value that is no larger than about 25 $\mu$m.

Thus, it is an advantageous feature of this invention that a multimorph transducer is bonded together in such a way as to markedly increase the deflection obtainable for a given applied charge. This feature arises by eliminating adhesive from the laminate.

It is a further advantageous feature of this invention that very thin, electroded layers of the polymer can be manufactured into a multilayered laminate, useful as a capacitor or a multimorph, without the handling problems created by certain prior art techniques.

Other advantageous features will become apparent upon reference to the following "Description of the Preferred Embodiments", when read in light of the attached drawings.

DESCRIPTION OF THE PREFERRED EMBODIMENTS

Most of the discussion hereinafter is directed to those laminates in which each polymeric film is wholly or partially $PVF_2$, the most preferred embodiments. In addition, the invention is applicable to such laminates wherein only one, or even none, of the polymer films is $PVF_2$. Thus, it is applicable to other orientable dielectric polymers such as polyesters, e.g., polyethylene terephthalate, polypropylene, propylene and polyethylene.

As used herein, "laminate" means a finished article of manufacture wherein the layers are bonded together. $PVF_2$ laminates suitable for use as capacitors and/or piezoelectric multimorphs surprisingly can be readily made without the use of adhesives. The key to this advance is to rely upon the metal layer deposited on one or both sides of each polymer layer as the bonding medium for the laminate, even though such metal layers are generally free of adhesive. As will be apparant hereinafter, such bonding occurs preferably by applying significant amounts of pressure and heat to the laminates.

As used herein, "$PVF_2$ film", "$PVF_2$ laminates", "$PVF_2$ sheet", or "$PVF_2$ layer" refers to a film, laminate, sheet or layer, respectively, comprising a polymer, such polymer comprising recurring units of which at least 50 mole % are derived from vinylidene fluoride. Preferably, such vinylidene fluoride recurring units are crystallized predominantly in the beta phase; that is, at least 60%, by weight, of the crystalline portion of the polymer is beta phase in its structure. Thus, each polymer layer can be a copolymer or a mixture of polymers, as well as a homopolymer of vinylidene fluoride. For purposes of the preferred embodiments, the homopolymer will be illustrated.

Figure 1:
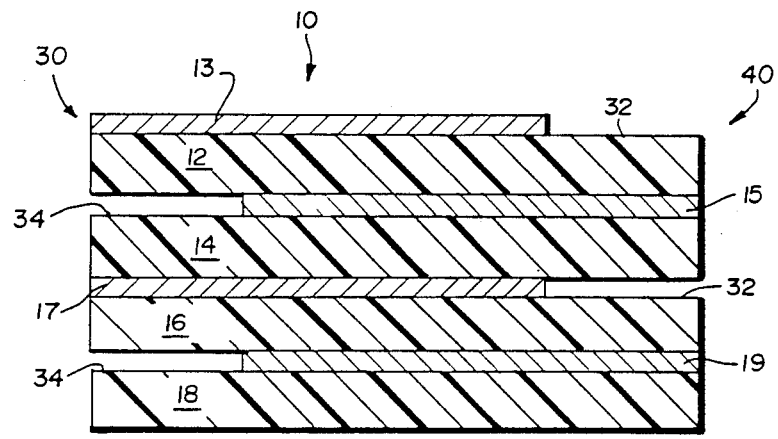
FIG. 1 is a section view of a laminate made in accordance with the invention.

Such a laminate 10 is illustrated in FIG. 1. Four $PVF_2$ sheets 12, 14, 16 and 18 are bonded physically together through the dry coherent metal electrode layer 13, 15, 17 and 19 deposited on each of the sheets 12, 14, 16 and 18, respectively. The bond is so strong that any attempt to separate the laminate results in failure of either the polymeric layers or the metal layers internally, rather than at the plastic-to-metal bond.

It will be readily apparent that the metal layers are deposited so as to alternate edge coverage of the underlying $PVF_2$ sheet. That is, layer 13 is deposited on sheet 12 so as to fully extend to the left edge 30, but to leave exposed portion 32 adjacent right edge 40. The same is true for $PVF_2$ sheet 16. However, the alternating sheets 14 and 18 have the metal layers deposited so as to leave exposed the left-hand portion 34 adjacent to the left edge 30.

The dimensions of the laminate are of concern primarily in the final thickness. The metal layers are of a final thickness as to provide a sheet resistance of from 1 to 4 ohms/square. In the case of aluminum, this means a thickness of about 500Å. Other electrically conductive metals are also useful, for example, copper, silver, zinc and gold.

The final thickness of each of the $PVF_2$ sheets is no more than about 25 $\mu$m, in order to maximize their dielectric properties. Preferably, the thickness is 5 $\mu$m or less.

The laminate so formed is generally free of adhesive, particularly since, as will become apparent, preferably no adhesive is used in the process. Instead, the metal layers are so tightly bonded to the $PVF_2$ sheet contacting both sides of the metal that it is impossible to strip a $PVF_2$ sheet from the laminate without pulling some (but not all) of the metal off the next adjacent layer.

Thus, as used herein, "generally free" means preferably zero amounts, but in any case, no more than about 4 weight % based on the total weight of the laminate. More than this has a significant adverse affect on the laminate's performance.

Figure 2:
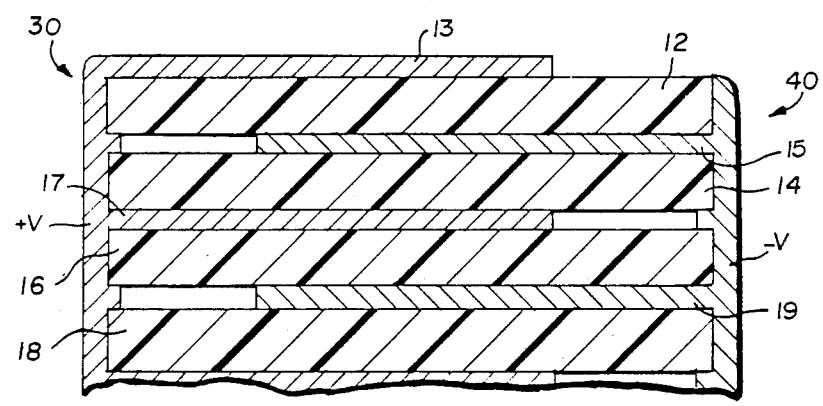
FIG. 2 is a fragmentary section view similar to FIG. 1, except that there is illustrated a further step in the process of the invention.
Figure 3:
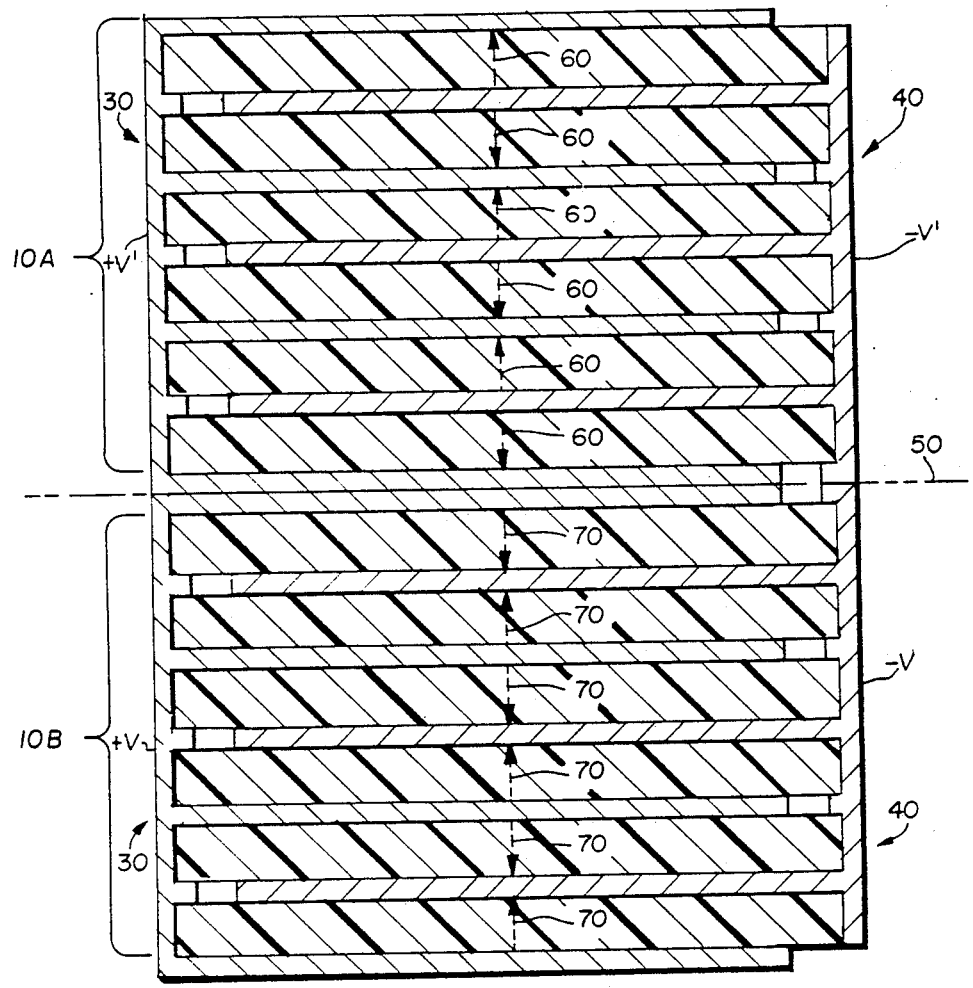
FIG. 3 is a partially schematic section view of a multimorph made in accordance with the invention.

Preferably, the laminate so formed is further processed in order to make it into a capacitor or a piezoelectric multimorph. That is, FIG. 2, electrically conductive metal is deposited or applied onto edges 30 and 40, such as by flame-spraying. Such metal bonds with the metal electrode layer of every other sheet, that is, the metal at edge 30 with layers 13 and 17, and the metal at edge 40 with layers 15 and 19. If the laminate is to be a capacitor, it need only be enclosed, as a further step, in a suitable plastic and lead wires connected. Alternatively, if it is to be a piezoelectric multimorph, the laminate is preferably poled with a suitable voltage, such as $+V$ and/or $-V$ applied as shown, to make it piezoelectric. Thereafter, two such laminates 10A and 10B, but with opposite polarities, are bonded together about a central plane 50, FIG. 3, to form the completed transducer. The laminate 10A has been poled so as to expand as shown schematically by arrows 60, when a $+V'$ or $-V'$ voltage is applied to respective edges 30 and 40. In contrast, laminate 10B has been poled so as to contract (arrows 70) when a $+V'$ voltage is applied to edge 30 (and/or a $-V'$ voltage applied to edge 40). As a result, the entire multimorph bends in a direction perpendicular to plane 50, as is well known.

Figure 4:
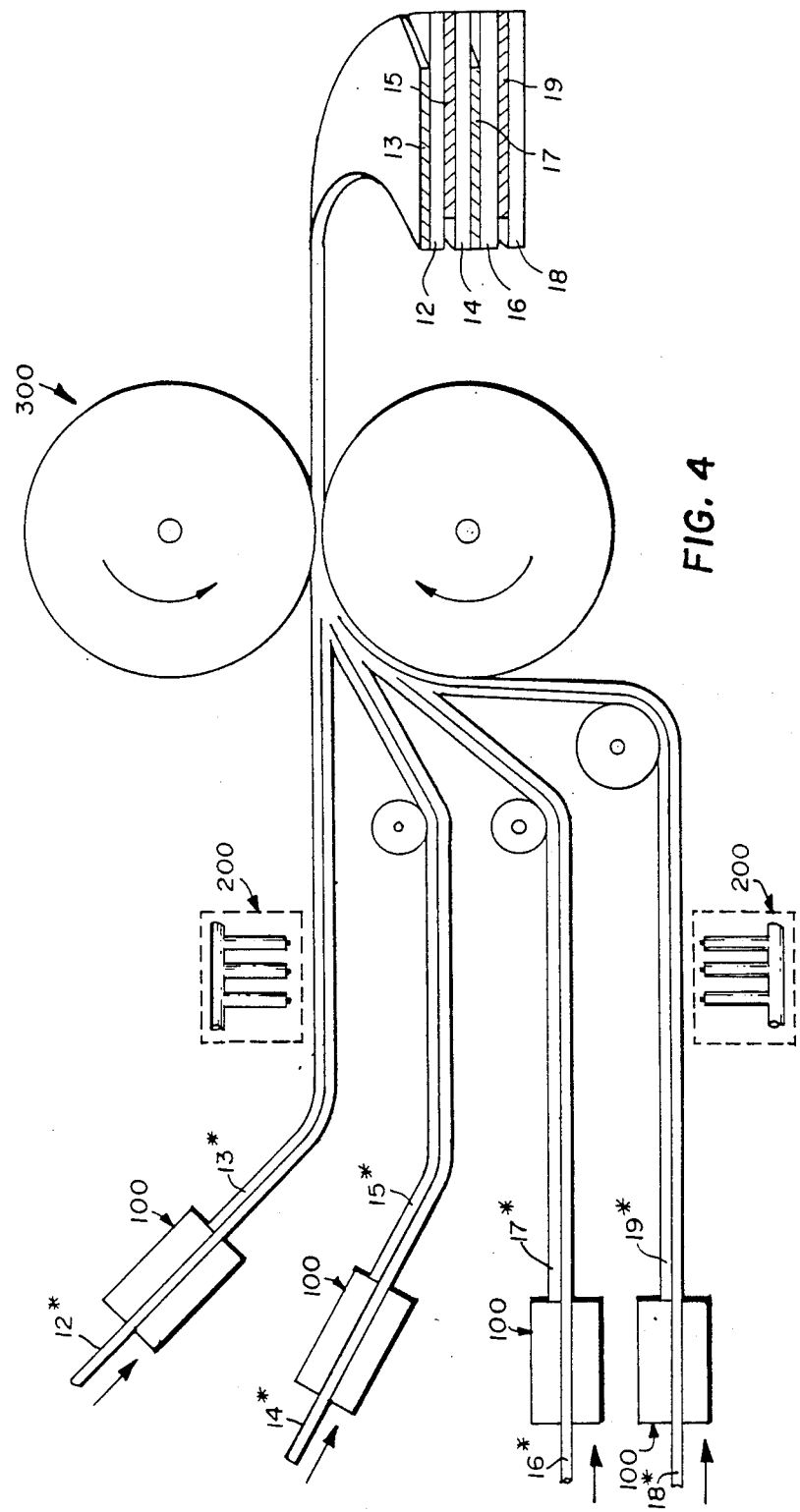
FIG. 4 is a partially schematic, fragmentary illustration of the process of the invention.

The process, FIG. 4, for achieving the formation of the laminate is as follows: "N" sheets of $PVF_2$ are fed into the apparatus, wherein for example N=4 (sheets 12*, 14*, 16*, and 18*, the asterisk indicating the sheets have not yet been stretched or reduced by the process of the invention). These sheets can be predominantly beta phase, as defined above, or they can be predominantly alpha phase, wherein the same definition applies for the amount of alpha phase present. Thereafter, the sheets are electroded by passing them into a metal deposition stage, schematically shown as boxes 100. Such a stage can be a continuous vacuum metallizer, and in any event is conventional and thus requires no further discussion, except that the thickness to be deposited is selected so that the final reduced thickness is that described for FIG. 1. Although only one side of each $PVF_2$ sheet is deposited with a metal layer 13*, 15*, 17* and 19*, respectively, to achieve the structure of FIG. 1, optionally both sides can be so deposited.

Alternatively, each of sheets 12*, 14*, 16* and 18* can be electroded by passing a single polymer sheet through a single metal deposition stage 100, after which the electroded sheet is cut into the 4 separate sheets shown.

Thereafter, the 4 electroded sheets can be drawn directly into roller mill 300. Optionally, however, they pass through a stage 200 which wets the outermost layers 13* and 18* with an aqueous liquid, such as with an aerosol spray. The spray preferably is free of adhesive, inasmuch as adhesive has the detriments discussed above.

Roller mill 300 operates at high pressure and preferably raised temperatures. These are selected to insure that the final thickness of each sheet 12, 14, 16 and 18 is no greater than about 25 $\mu$m. Useful pressure ranges include from 900 to about 5000 kilos/cm, for example, about 118,000 kilos (260,000 lbs) applied over 25.4 cm of lineal contact, or about 4643 kilos/cm. Useful temperature ranges include from about 20° C. to about 140° C.

Further details concerning the use of the roller mill can be found in the literature, for example, the *SPE Journal,* Dec. 1971, pages 42–48.

The afore-described process, when applied to laminates in which all the polymer film is a polyester such as polyethylene terephthalate, or all the film is polypropylene or polyethylene, provides superior capacitors. Such non-$PVF_2$ polymers are superior to $PVF_2$ because of thermal properties (some polyesters), or lower dissipation factors needed in high-frequency communications (polypropylene or polyethylene).

Preferably, poling, if it is to be used, (e.g., on $PVF_2$ laminates) occurs at a stage following roller mill 300. Optionally, it can be done at the mill by applying the poling voltage $+V$ to one of the rollers, but this requires a biasing of the alternate metal layers in a manner similar to that described in FIG. 6 of the aforesaid U.S. Pat. No. 4,427,609. The poling is conducted so as to induce piezoelectricity of at least $d_{31}=5\times10^{-12}$ m/volt, wherein $d_{31}$ is the well-known piezoelectric strain coefficient.

It has been found that a transducer made by the present invention, wherein the number of sheets is 10 and the applied voltage is 100V for a beam length of 1 cm, the $PVF_2$ sheets have a thickness of about $9\times10^{-6}$ m, and an electrode thickness of 500Å, gave a beam deflection of within 5% of the theoretical 0.31 mm value noted in the aforesaid *Ferroelectric* article, Table V, p. 214, a marked improvement over a comparable transducer made however using adhesive between each electroded layer.

EXAMPLES

The following examples further illustrate the invention.

Example 1

Eight $PVF_2$ homopolymer sheets of 25 $\mu$m thickness each were cast as alpha phase film. These sheets were electroded with deposited aluminum, totally free of adhesive, having a thickness of about 2000Å, on both sides of each sheet of $PVF_2$. The electroded sheets were not sprayed with an aerosol spray in this example. Thereafter, the sheets were passed through a roller mill delivering about 4643 kilos of pressure per cm, at a temperature of 71° C. The resultant laminate had a total thickness of about 50 $\mu$m, or a thickness of about 6.25 $\mu$m per $PVF_2$ sheet, and a dielectric constant for each $PVF_2$ sheet of 14.0 at 1 KHz. The laminate could not be pulled apart. A portion of the laminate was then polarized using a field of 1 MV/cm at 80° C. for 1 hr, to produce an effective $d_{31}$ of $20\times10^{-12}$ m/V. This plus the fact that the metal layers 13, 15, 17 and 19 were found to have the desired surface resistivity, indicated that the metal layers retained their continuity through the rolling process.

Example 2

The process of Example 1 was repeated, except that there were 10 sheets of $PVF_2$ homopolymer fed to a mill such as roller mill 300, each sheet having an initial thickness of 24–25 $\mu$m with one side only coated with 2500Å-thick aluminum applied by magnetron sputtering. The roller mill was heated to 74° C. and loaded with about 4643 kilos/cm of pressure. Prior to rolling, the outside sheets were sprayed with an aerosol comprising about 0.05 weight % of sodium dioctylsulfosuccinate. The final thickness of each $PVF_2$ sheet was about 8 $\mu$m and the final dielectric constant was 13.0 at 1 KHz. The metal layers after rolling had a resistivity of about 3 ohms per square.

The invention has been described in detail with particular reference to preferred embodiments thereof, but it will be understood that variations and modifications can be effected within the spirit and scope of the invention.

What is claimed is:

1. A laminate useful in thin film electrical devices, comprising alternating layers of electrically conductive metal and an orientable polymer film, each layer of metal being integrally bonded to both adjacent layers of film, said laminate
    (a) having a thickness for each polymer film that does not exceed about 25 $\mu$m, and a resisitivity of each metal layer of from about 1 to about 4 ohms/square, and
    (b) being generally free of adhesive between adjacent layers of polymeric film,
    said metal layers of the laminate extending across only a fraction of the width of the adjacent polymer film layers, so as to leave exposed a side margin of said dielectric film layers, such side margin being the same side margin for every other one of said polymer film layers, and the opposite side margin for those in between,
    and further including electrode metal along the side edges of said layers, the electrode metal at each side bonding together every other metal layer that extends to said each side.

2. A laminate as defined in claim 1, wherein at least one of such films comprises a polymer of which at least 50 mole % of the recurring units are derived from vinylidene fluoride.

3. A laminate as defined in claim 1 or 2, wherein said polymer film comprises polyvinylidene fluoride with a crystalline structure that is predominantly beta phase.

4. A capacitor comprising a laminate as defined in claim 3.

5. A piezoelectric multimorph comprising a laminate as defined in claim 3, poled an amount sufficient to induce piezoelectric activity of $d_{31}=5\times10^{-12}$ m/volt.

6. A method for making a laminate useful in thin film electrical devices, comprising the steps of
    (a) providing multiple layers of an orientable polymer film having thicknesses no greater than about 100 $\mu$m;
    (b) applying a dry coating of electrically conductive metal that is generally free of adhesive, on a surface of each of said layers, said metal coatings having a maximum thickness no greater than the which is effective, after the next step in the method, to produce a resistivity of about 1 to 4 ohms/square, said coatings being applied so that alternating edges of said film layers at the coated surfaces have metal applied thereto, leaving exposed an opposite edge for each said polymeric film;
    (c) compressing and laminating together simultaneously all of said coated polymeric film layers under pressure sufficient to (i) reduce the thickness of each of said polymeric film layers to a value that is no larger than about 25 $\mu$m, and (ii) bond said multiple layers together; and (d) metallizing the opposite edges of the laminate produced by step (c) to electrically connect the metallized coatings on alternate layers of the reduced polymeric film layers.

7. A method as defined in claim 6, wherein at least one of said films comprises a polymer at least 50 mole % of the recurring units of wich are derived from vinylidene fluoride.

8. A method as defined in claim 6, and further including prior to said step (c), the step of wetting the surfaces of said metal-coated polymeric film that are exposed to the compressing force of step (c), with an aqueous liquid.

* * * * *